(12) United States Patent
Cáceres Del Viso et al.

(10) Patent No.: US 11,521,910 B2
(45) Date of Patent: Dec. 6, 2022

(54) HIGH-CONDUCTANCE THERMAL CONNECTOR

(71) Applicant: AIRBUS DEFENCE AND SPACE SA, Madrid (ES)

(72) Inventors: Felipe Cáceres Del Viso, Madrid (ES); Marc Perellón Marsá, Madrid (ES); María José Aparicio Ordobás, Madrid (ES); Carlos Roberto Samartín Pulián, Madrid (ES)

(73) Assignee: AIRBUS DEFENCE AND SPACE SA, Madrid (ES)

( * ) Notice: Subject to any disclaimer, the term of this patent is extended or adjusted under 35 U.S.C. 154(b) by 225 days.

(21) Appl. No.: 16/957,671

(22) PCT Filed: Dec. 29, 2017

(86) PCT No.: PCT/ES2017/070866
§ 371 (c)(1),
(2) Date: Jun. 24, 2020

(87) PCT Pub. No.: WO2019/129896
PCT Pub. Date: Jul. 4, 2019

(65) Prior Publication Data
US 2020/0328134 A1    Oct. 15, 2020

(51) Int. Cl.
*B64G 1/50* (2006.01)
*H01L 23/373* (2006.01)

(52) U.S. Cl.
CPC ...... *H01L 23/3735* (2013.01); *H01L 23/3737* (2013.01); *B64G 1/50* (2013.01)

(58) Field of Classification Search
CPC ... B64G 1/50; H01L 23/3737; H01L 23/3735; H01L 23/373; H01L 23/367; F28F 21/02
See application file for complete search history.

(56) References Cited

U.S. PATENT DOCUMENTS 5,255,738 A * 10/1993 Przilas ............... H05K 7/205
165/905
5,296,310 A    3/1994 Kibler et al.
(Continued)

FOREIGN PATENT DOCUMENTS

| EP | 1025586 B1 | 6/2006 |
|---|---|---|
| EP | 2597041 A1 | 5/2013 |
| JP | 2003092384 A * | 3/2003 |

OTHER PUBLICATIONS

JP2003092384A mt (Year: 2003).*
International Search Report for PCT/EP2017/070866, dated Oct. 1, 2018.

*Primary Examiner* — Gordon A Jones
(74) *Attorney, Agent, or Firm* — Merchant & Gould P.C.

(57) ABSTRACT

A high conductance thermal link (1) includes a thermal conductive strap (2) having pyrolytic graphite layers arranged in stacks (5) and polyimide film (6) at least partially covering each stack (5). Adhesive material is between the pyrolytic graphite layers. The thermal conductive strap (2) has two opposite ends (4) and two end fittings (3, 3') that house the corresponding ends (4) of the thermal conductive strap (2). An adhesive material is in the ends (4) of the thermal conductive strap (2) between the pyrolytic graphite layers and between the stacks (5) of pyrolytic graphite layers. At least one of the ends (4) of the thermal conductive strap (2) has a geometry including protrusions (7) separated by intermediate gaps (8).

4 Claims, 3 Drawing Sheets

(56) References Cited

U.S. PATENT DOCUMENTS

| | | | |
|---|---|---|---|
| 6,131,651 A | 10/2000 | Richey, III | |
| 6,286,591 B1* | 9/2001 | Bonneville | H05K 7/20445 |
| | | | 165/185 |
| 7,303,820 B2* | 12/2007 | Capp | B32B 5/30 |
| | | | 428/408 |
| 9,271,427 B2* | 2/2016 | Kilroy | H01L 23/373 |
| 2002/0163076 A1* | 11/2002 | Tzeng | H01L 23/373 |
| | | | 257/E23.106 |
| 2004/0001317 A1* | 1/2004 | Getz, Jr. | H01L 23/3672 |
| | | | 174/16.3 |
| 2004/0131835 A1* | 7/2004 | Schmitt | H01L 23/3733 |
| | | | 428/293.1 |
| 2014/0065399 A1* | 3/2014 | Weng | B05D 3/02 |
| | | | 427/372.2 |
| 2014/0158334 A1 | 6/2014 | Dellea et al. | |
| 2015/0096731 A1* | 4/2015 | Koch | F28F 3/02 |
| | | | 264/339 |
| 2015/0211815 A1 | 7/2015 | Sauer et al. | |
| 2020/0307158 A1* | 10/2020 | Sinfield | B32B 15/043 |

\* cited by examiner

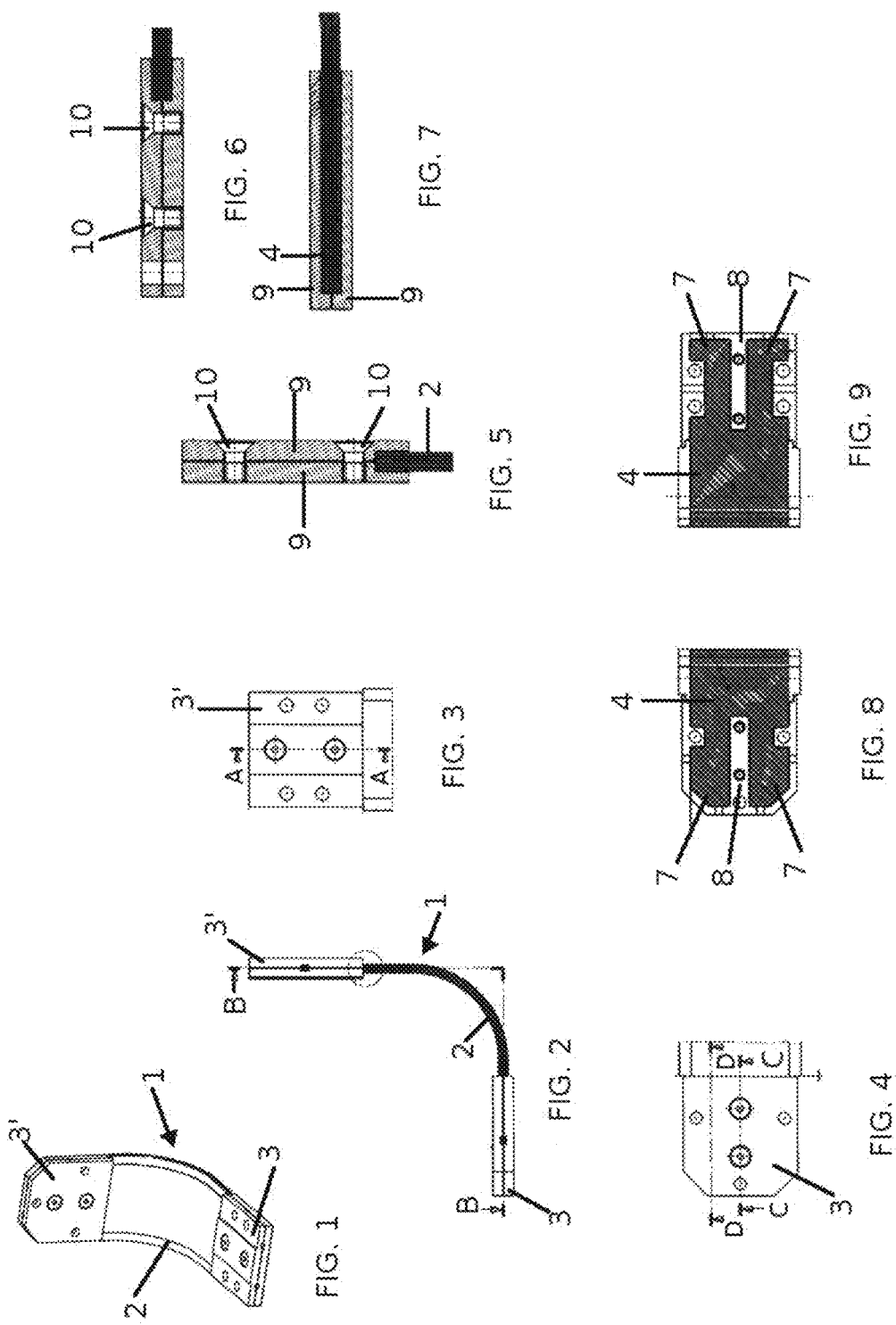

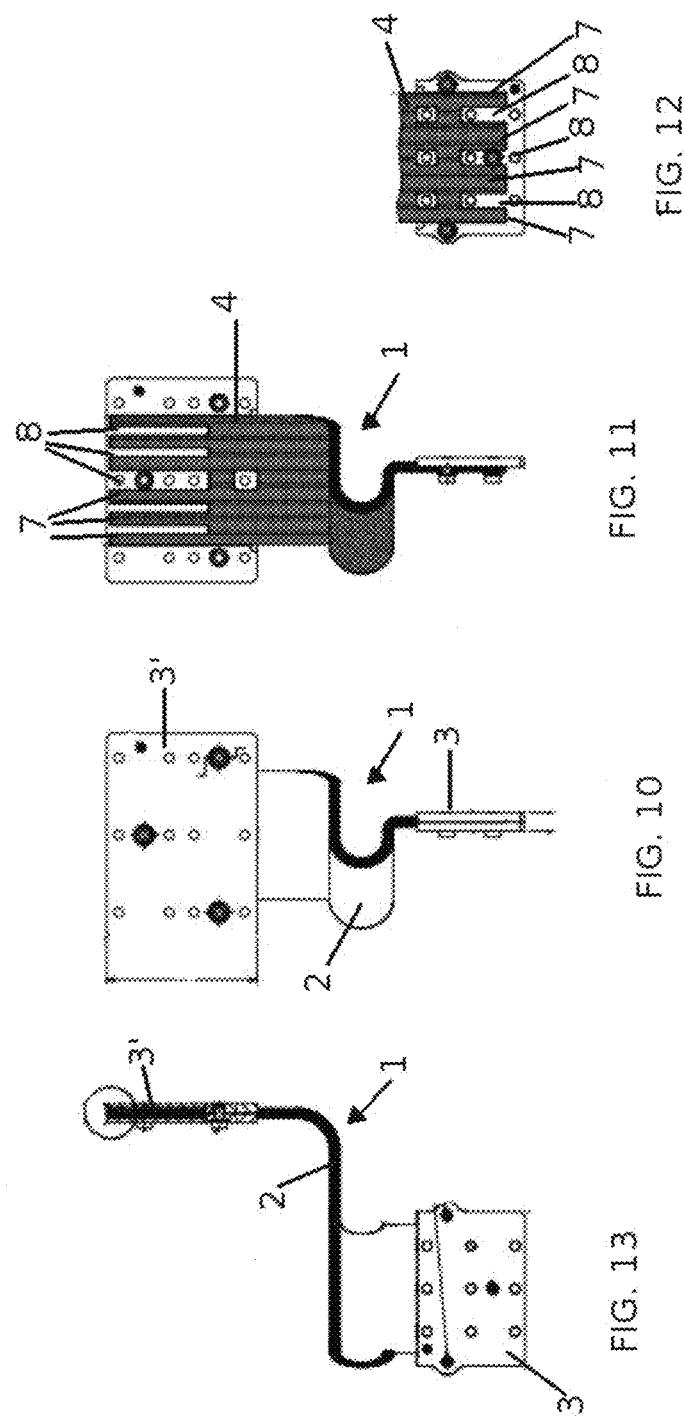

HIGH-CONDUCTANCE THERMAL CONNECTOR

This application is a National Stage Application of PCT/ES2017/070866, filed Dec. 29, 2017, and which application is incorporated herein by reference. To the extent appropriate, a claim of priority is made to the above-disclosed application.

FIELD OF THE INVENTION

This invention refers to a high conductance thermal link, specially used to deal with the thermal management of equipment and avionics on a spacecraft in a space environment.

BACKGROUND OF THE INVENTION

The thermal control of the equipment used in space based research is the key to a perfect performance of these complex tools which have highly demanding requirements.

The thermal control system is responsible of maintaining component temperature ranges during the whole mission of a spacecraft or satellite. Thermal straps are a thermal path for heat transfer that is used as a tool to control these temperatures inside the spacecraft structure. A thermal path is the tracing of heat flow from the point where it enters the system, to the surface or point where it leaves the system.

A usual part of these thermal control parts is a flexible thermal strip that ties the cooling instrument or equipment to the heat sink. It has to transport heat (i.e., it must have high conductance properties) and also have a flexibility that allows it to be set up on any precise position of the spacecraft structure, without reducing its performance. The mechanical and/or geometrical constraints are very important when designing the thermal control system of a flight hardware.

Thermal strips are used in various industries as a system to control temperature variation on electrical and optical equipment. They are usually commercialized as straps with connectors at the ends, and are usually made of copper, aluminium or organic materials.

Thermal links are a passive system of thermal control on the spacecraft. They have no mechanical moving parts or moving fluids. They have no power consumption, a low mass and are highly reliable.

Heat may be transferred on satellites by conduction or by radiation. Thermal straps conduct heat from the equipment to radiators through conductive processes.

Thermal links can be classified according to the material used in metallic links and graphite links; inside those two types, that can be foil or sheet made, or threaded wires links. Metallic thermal straps are the most widely used. They are made of aluminium alloys or copper. The flexibility of the metallic straps depends on the single wire diameter. The high robustness and reliability of these metals has made it a useful tool in space applications. However, its mass can be a drawback, mainly in the case of copper.

The development of graphite based thermal links has opened a wide opportunity for weight reduction. They can be made of pyrolytic graphite or high conductive carbon fibers, for in-stance.

An example of a construction that uses pyrolytic graphite for thermal management can be found in U.S. Pat. No. 5,296,310 A (referred to k-Core® product, commercialized by Thermacore), entitled "High Conductivity Hybrid Material for Thermal Management".

EP 1025586 B1 refers to a "Flexible Heat Transfer Device and Method". The heat transfer device for transferring heat from a heat source to a heat sink comprises a high thermal conductivity core material of pyrolytic graphite or highly ordered pyrolytic graphite.

EP 2597041 B refers to a thermal strap formed by fibres or foils and comprising a flexible middle section and two rigid end parts. The fibres or foils are embedded in a rigid matrix material thus forming the rigid end parts.

The laminar graphite is a material with good thermal conductivity properties in its plane, but with bad conductivity in the normal direction.

Accordingly, there is a need to obtain a graphite based thermal links with enhanced conductance also in the normal direction.

SUMMARY OF THE INVENTION

The object of the invention is to provide a thermal link with enhanced conductance, also in the normal direction.

The invention provides a high conductance thermal link, that comprises:
  a thermal conductive strap comprising pyrolytic graphite layers arranged in stacks and polyimide film at least partially covering each stack, with adhesive material between the pyrolytic graphite layers, the thermal conductive strap having two opposite ends, and
  two end fittings that house the corresponding ends of the thermal conductive strap, wherein in the ends of the thermal conductive strap there is an adhesive material between the pyrolytic graphite layers and between the stacks of pyrolytic graphite layers, and at least one of the ends of the thermal conductive strap has a geometry comprising several protrusions separated by intermediate gaps.

The invention allows a better conductivity with respect to the prior art thermal links, including the metallic ones. Accordingly, it can dissipate the heat generated in the electronic and optical equipment in a better way, avoiding the overheating of the spacecraft or satellite.

Another advantage of the invention is that it reduces the necessary mass with respect to the prior art thermal links.

Another advantage of the invention is that it has no limits in length or width, so it can adopt different geometries according to different needs.

Other characteristics and advantages of the present invention will be clear from the following detailed description of several embodiments illustrative of its object in relation to the attached figures.

BRIEF DESCRIPTION OF DRAWINGS

FIG. 1 shows a perspective view of an embodiment of the high conductance thermal link of the invention.

FIG. 2 shows a side view of the high conductance thermal link of FIG. 1.

FIG. 3 shows a front view of one of the end fittings of the high conductance thermal link of

FIG. 1.

FIG. 4 shows a front view of the other end fitting of the high conductance thermal link of FIG. 1.

FIG. 5 shows the cross-section A-A of FIG. 3.

FIG. 6 shows cross-section C-C of FIG. 4.

FIG. 7 shows the cross-section D-D of FIG. 4.

FIGS. 8 and 9 show the cross-section B-B of FIG. 2, corresponding to the end fittings.

FIG. 10 shows a perspective view of another complex embodiment of the high conductance thermal link of the invention.

FIG. 11 is a view of the high conductance thermal link of FIG. 10, showing the configuration of one of the ends of the thermal conductive strap.

FIG. 12 shows the configuration of the other end of the thermal conductive strap.

FIG. 13 is another view of the high conductance thermal link of FIG. 10.

DETAILED DESCRIPTION OF THE INVENTION

Figure 14:
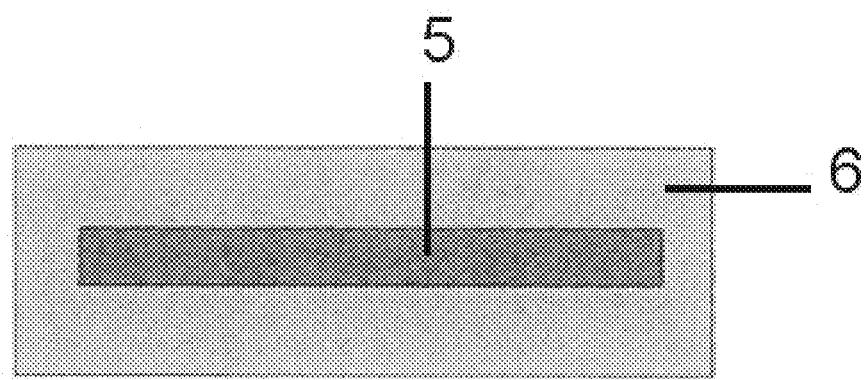
FIG. 14 shows a cross-section of a stack of pyrolytic graphite layers covered by polyimide film.

FIG. 1 shows a high conductance thermal link 1 that comprises two end fittings 3, 3' and a thermal conductive strap 2.

The thermal conductive strap 2 comprises pyrolytic graphite layers arranged in stacks 5, and polyimide film 6 at least partially covering each stack 5 of pyrolytic graphite layers, with adhesive material between the pyrolytic graphite layers. The thermal conductive strap 2 has two opposite ends 4, each one of them arranged inside the corresponding end fitting 3, 3' (see FIGS. 5-9), that houses the corresponding end 4 of the thermal conductive strap 2.

In FIGS. 8 and 9 it can be seen that the ends 4 of the thermal conductive strap 2 have a geometry with two protrusions 7 separated by an intermediate gap 8.

In the ends 4 of the thermal conductive strap 2 there is an adhesive material between the pyrolytic graphite layers and between the stacks 5 of pyrolytic graphite layers.

This configuration of the high conductance thermal link 1 allows a better heat transfer between the pyrolytic graphite layers and end fittings 3, 3'.

The layers of pyrolytic graphite can be arranged as sheets (i.e., with planar or flat shape).

In one embodiment the stacks 5 of pyrolytic graphite in the ends 4 of the thermal conductive strap 4 lodged inside the end fittings 3, 3' are not covered by polyimide film 6 (i.e., they are only covered by polyimide film 6 in the intermediate section of the thermal conductive strap 2 between both ends 4).

The end fittings 3, 3' can be composed of two symmetrical halves 9, that can be attached by joining means 10 (see FIGS. 5 and 6), housing the corresponding ends 4 of the thermal conductive strap 2.

The end fittings 3, 3' can be made of metal (for example, aluminium) or organic materials.

FIGS. 10 to 13 show another complex embodiment of a high conductance thermal link 1 of the invention. As it can be seen, the thermal link 1 of the invention has enough flexibility to be able to adapt to different needs and geometries.

FIGS. 11 and 12 show the configuration of the ends 4 of the thermal conductive strap 2. It can be seen that the ends 4 of the thermal conductive strap 2 have a geometry with several protrusions 7 (in this case, more than two ones) separated by intermediate gaps 8.

In order to be able to obtain the enhanced performance, the thermal link 1 has an optimized design at its ends, where pyrolytic graphite layers are placed in high conductivity adhesive to assure a good thermal conductivity between the thermal conductive straps 2 and the corresponding end fittings 3, 3'.

The internal design of the ends of the thermal link 1 is a key factor to generate the conductivity in the normal direction of the thermal conductive strap 2, as the pyrolytic graphite has good conductive properties only in plane.

According to one embodiment, the stacks 5 of pyrolytic graphite in the ends 4 of the thermal conductive strap 2 lodged inside the end fittings 3, 3' are not covered by polyimide film 6.

FIG. 14 shows a cross-section of a stack 5 of pyrolytic graphite layers covered by polyimide film 6.

The symmetrical configuration of the end fittings 3, 3', together with the arrangement of the stacks 5 of pyrolytic graphite in the ends 4 of the thermal conductive strap 2 lodged inside the end fittings 3, 3', allow that the heat can flow through the faces of the end fittings 3, 3' (i.e., it allows several thermal paths).

The thermal strap 2 has no limits in length or width, so it can adopt different geometries according to different needs (i.e., it can be rectangular, square, or in any desired shape with the desired dimensions).

Another advantage is that the thermal link 1 of the invention does not transmit mechanical loads between the end fittings 3, 3' because of its high flexibility which decouples mechanically one end of the thermal strap 2 from the other.

Although the present invention has been fully described in connection with preferred embodiments, it is evident that modifications may be introduced within the scope thereof, not considering this as limited by these embodiments, but by the contents of the following claims.

The invention claimed is:

1. A high conductance thermal link comprising:
a thermal conductive strap comprising pyrolytic graphite layers arranged in stacks and polyimide film at least partially covering each stack, with adhesive material between the pyrolytic graphite layers, the thermal conductive strap having two opposite ends, and
two end fittings that house the corresponding ends of the thermal conductive strap, at least one of the two opposite ends of the thermal conductive strap having a geometry comprising a plurality of protrusions separated by intermediate gaps,
an adhesive material in the two opposite ends of the thermal conductive strap between the pyrolytic graphite layers and between the stacks of pyrolytic graphite layers, the stacks of pyrolytic graphite layers being covered by polyimide film, and the two end fittings comprise two symmetrical halves attached by connector elements.

2. The high conductance thermal link according to claim 1, wherein the layers of pyrolytic graphite are arranged as sheets.

3. The high conductance thermal link according to claim 1, wherein the two end fittings are made of metal or made of organic material.

4. The high conductance thermal link according to claim 1, wherein the adhesive material is only in the two opposite ends of the thermal conductive strap.

* * * * *